(12) United States Patent
Nishibayashi et al.

(10) Patent No.: US 7,534,360 B2
(45) Date of Patent: May 19, 2009

(54) METHOD OF MAKING DIAMOND PRODUCT AND DIAMOND PRODUCT

(75) Inventors: Yoshiki Nishibayashi, Suita (JP); Kiichi Meguro, Itami (JP); Takahiro Imai, Itami (JP); Yutaka Ando, Suita (JP)

(73) Assignees: Sumitomo Electric Industries, Ltd., Osaka (JP); Japan Fine Ceramics Center, Aichi (JP)

(*) Notice: Subject to any disclaimer, the term of this patent is extended or adjusted under 35 U.S.C. 154(b) by 0 days.

(21) Appl. No.: 10/774,417

(22) Filed: Feb. 10, 2004

(65) Prior Publication Data
US 2005/0000938 A1 Jan. 6, 2005

Related U.S. Application Data

(62) Division of application No. 09/995,854, filed on Nov. 29, 2001, now Pat. No. 6,709,730.

(30) Foreign Application Priority Data

Nov. 29, 2000 (JP) ............... 2000-363254
Aug. 23, 2001 (JP) ............... 2001-253546

(51) Int. Cl.
*C23F 1/00* (2006.01)
(52) U.S. Cl. .............. 216/11; 216/51; 216/60; 216/67; 216/81
(58) Field of Classification Search ............. 216/4, 216/11, 41, 67, 81
See application file for complete search history.

(56) References Cited

U.S. PATENT DOCUMENTS

| | | | |
|---|---|---|---|
| 4,957,591 A | 9/1990 | Sato et al. | |
| 6,013,191 A * | 1/2000 | Nasser-Faili et al. | 216/67 |
| 6,184,611 B1 | 2/2001 | Saito et al. | |
| 6,213,856 B1 | 4/2001 | Cho et al. | |
| 6,261,726 B1 * | 7/2001 | Brooks et al. | 430/5 |
| 6,439,986 B1 | 8/2002 | Myoung et al. | |

FOREIGN PATENT DOCUMENTS

| | | |
|---|---|---|
| EP | 0 458 530 A2 | 5/1991 |
| EP | 0 859 409 A2 | 2/1998 |

(Continued)

OTHER PUBLICATIONS

Nitrogen Enhanced Selectivity of Debris (Carbon -Material) Versus Polyimide, Dec. 1, 1987, IBM Technical Disclosure Bulletin, vol. 30, No. 7, pp. 128-129.*

(Continued)

*Primary Examiner*—Allan Olsen
(74) *Attorney, Agent, or Firm*—McDermott Will & Emery LLP

(57) ABSTRACT

The method of making a diamond product in accordance with the present invention comprises the steps of forming a diamond substrate (50) with a mask layer (52), and etching the diamond substrate (50) formed with the mask layer (52) with a plasma of a mixed gas composed of a gas containing an oxygen atom and a gas containing a fluorine atom, whereas the fluorine atom concentration is within the range of 0.04% to 6% with respect to the total number of atoms in the mixed gas.

11 Claims, 14 Drawing Sheets

FOREIGN PATENT DOCUMENTS

EP 0 865 065 A1 9/1998
WO WO 99/22049 10/1997

OTHER PUBLICATIONS

K. Okano, "Mold growth of polycrystalline pyramidal-shape daimond for field emitters", Diamond and Related Materials 5, (1996), pp. 19-24.

Hiroshi Shiomi, "High-Rate Reactive Etching of Diamond and Fabrication of Porous Diamond for Field-Emission Cathode", New Diamond, vol. 13, No. 4, pp. 28-29.

W.P. Kang, et al., "Micropatterned polycrystalline diamond field emitter vacuum diode arrays", J.Vac. Sci Technol. B 14(3), May/Jun. 1996, pp. 2068-2071.

Hiromu Shiomi, "Reactive Ion Etching of Diamond in O2 and CF4 Plasma, and Fabrication of Porous Diamond for Field Emitter Cathodes," Jpn. J. Appl. Phys., 1997, pp. 7745-7748, vol. 36.

Hong J. et al, "Etching process of hydrogenated amorphous carbon (a-C:H) thin films in a dual ECR-r.f. nitrogen plasma", vol. 8, No. 2-5, Mar. 1999, pp. 572-576, XP004364947.

Basche B., "Optische Emissionsspektroskopie Zum Analysieren Von Plasma", vol. 98, No. 6, Jun. 1, 1990, pp. 272-274, XP000132699.

Valyi G. et al, "Analysis of chemical processes of plasma etching", vol. 76, No. 3, Feb. 13, 1981, pp. 215-219, XP002381595.

Search Report dated Jun. 21, 2006.

\* cited by examiner

Fig.10

| Sample No. | Etching condition | | | | | | |
|---|---|---|---|---|---|---|---|
| | CF4/ (CF4+O2) (%) | C/ (total atms) (%) | F/ (total atms) (%) | O/ (total atms) (%) | Power (W) | Power/ electrode area (W/cm2)) | Pressure (Pa) |
| Comparative example1 | 5 | 2 | 9 | 89 | 200 | 1.1 | 5 |
| Example1 | 3 | 1 | 6 | 93 | 200 | 1.1 | 5 |
| Example2 | 2 | 1 | 4 | 95 | 200 | 1.1 | 5 |
| Example3 | 1 | 0.5 | 2 | 97.5 | 200 | 1.1 | 5 |
| Example4 | 0.1 | 0.05 | 0.2 | 99.75 | 200 | 1.1 | 5 |
| Example5 | 0.05 | 0.02 | 0.1 | 99.88 | 200 | 1.1 | 5 |
| Example6 | 0.02 | 0.01 | 0.04 | 99.95 | 200 | 1.1 | 5 |
| Comparative example2 | 0.01 | 0.005 | 0.02 | 99.975 | 200 | 1.1 | 5 |
| Comparative example3 | 0 (O2 ONLY) | 0.0 | 0.0 | 100 | 200 | 1.1 | 5 |
| Example7 | 1 | 0.5 | 2 | 97.5 | 50 | 0.28 | 5 |
| Example8 | 1 | 0.5 | 2 | 97.5 | 80 | 0.45 | 5 |
| Example9 | 1 | 0.5 | 2 | 97.5 | 200 | 1.1 | 5 |
| Example10 | 1 | 0.5 | 2 | 97.5 | 280 | 1.6 | 5 |
| Example11 | 1 | 0.5 | 2 | 97.5 | 200 | 1.1 | 0.1 |
| Example12 | 1 | 0.5 | 2 | 97.5 | 200 | 1.1 | 40 |

Fig.11

| Sample No. | Surface state | Etching speed (diamond) (μm/h) | Etching depth (μm) | Angle of inclination (°) | Etching speed (mask layer) (μm/h) | Etching selection ratio |
|---|---|---|---|---|---|---|
| Comparative example1 | ○ | 3 | 1 | 72 | 3 | 1 |
| Example1 | ◎ | 5 | 10 | 88 | 0.28 | 18 |
| Example2 | ◎ | 8 | 16 | 89 | 0.27 | 30 |
| Example3 | ◎ | 10 | 20 | 90 | 0.25 | 40 |
| Example4 | ○ | 9 | 18 | 90 | 0.23 | 39 |
| Example5 | ○ | 8 | 16 | 90 | 0.22 | 36 |
| Example6 | ○ | 7 | 14 | 90 | 0.23 | 30 |
| Comparative example2 | × | 3 | 6 | 87 | 0.2 | 15 |
| Comparative example3 | × | 1 | 2 | 85 | 0.1 | 10 |
| Example7 | ○ | 1.5 | 2 | 78 | 0.05 | 30 |
| Example8 | ◎ | 3 | 3 | 85 | 0.14 | 36 |
| Example9 | ◎ | 10 | 20 | 90 | 0.25 | 40 |
| Example10 | ◎ | 12 | 24 | 90 | 0.34 | 35 |
| Example11 | ◎ | 9 | 18 | 90 | 0.22 | 41 |
| Example12 | ○ | 10 | 20 | 90 | 0.29 | 34 |

US 7,534,360 B2

METHOD OF MAKING DIAMOND PRODUCT AND DIAMOND PRODUCT

This application is a divisional of application Ser. No. 09/995,854 filed Nov. 29, 2001 now U.S. Pat. No. 6,709,730.

BACKGROUND OF THE INVENTION

1. Field of the Invention

The present invention relates to a method of making a diamond product by etching, and the diamond product.

2. Related Background Art

Plasma etching, which can remove a large amount of diamond at once and can be carried out relatively easily, has been utilized as a technique for processing diamond. Usually, oxygen gas is used for plasma etching of diamond. Etching with oxygen alone, however, has formed a large number of unnecessary acicular protrusions on the surface of the resulting diamond product, thus failing to smooth the surface. Therefore, attention has been given to a technique in which other gases are introduced into a reaction chamber together with oxygen gas so as to flatten the diamond surface. For example, Hiroshi Shiomi, *New Diamond*, Vol. 13, No. 4, p. 28 (1997) discloses a technique in which diamond is etched with a plasma of a mixed gas composed of oxygen gas and $CF_4$ gas. This etching technique enables the plasma of $CF_4$ gas to remove the unnecessary acicular protrusions and flatten the surface of diamond product.

SUMMARY OF THE INVENTION

However, the technique disclosed in the above-mentioned publication has the following problem. Namely, when a diamond substrate 102 is etched by way of a mask 104 as shown in FIG. 14A, thus etched side faces 102S may not become perpendicular but tilt greatly as shown in FIG. 14B, thus yielding a trapezoidal cross section.

In order to overcome the above-mentioned problem, it is an object of the present invention to provide a method of making a diamond product, which can fully flatten the surface of diamond product and make its etched side faces substantially perpendicular; and such a diamond product.

The inventors carried out diligent studies and, as a result, have found that the above-mentioned object can be achieved by the following invention.

Namely, the present invention provides a method of making a diamond product by etching, the method comprising the steps of forming a diamond substrate with a mask layer; and etching the diamond substrate formed with the mask layer with a plasma of a mixed gas composed of a gas containing an oxygen atom and a gas containing a fluorine atom; wherein the fluorine atom has a concentration within the range of 0.04% to 6% with respect to the total number of atoms in the mixed gas.

The inventors have found that, though the unnecessary protrusions can be eliminated when the fluorine concentration in the etching gas is raised, the mask layer is laterally shaved with fluorine when its concentration is too high, so that the etched side faces may incline. In recognition of this fact, the inventors have found that, when the fluorine atom concentration is lowered so as to fall within the above-mentioned range, the mask layer is restrained from being shaved laterally, whereby the etched side faces can be made substantially perpendicular; and that, even when the fluorine atom concentration is lowered so as to fall within the above-mentioned range, the number of unnecessary protrusions is sufficiently reduced, whereby the etched surface of diamond product is flattened.

Preferably, in the method of making a diamond product in accordance with the present invention, the plasma is produced by generating a high-frequency discharge between two plate electrodes arranged in parallel, whereas the high-frequency discharge is generated by supplying an electric power of at least 0.45 $W/cm^2$ between the plate electrodes.

When the output for generating the high-frequency discharge is enhanced as such, it becomes easier for the fluorine atom to attain a plasma state, whereby the number of unnecessary protrusions can sufficiently be reduced even when the amount of fluorine is small.

Preferably, in the method of making a diamond product in accordance with the present invention, the gas containing the fluorine atom is $CF_4$ gas, whereas the $CF_4$ gas has a concentration within the range of 0.02% to 3% with respect to the total number of molecules in the mixed gas.

When $CF_4$ gas, which is safe and easy to use, is employed, an etching process for the diamond substrate can be carried out smoothly.

Preferably, in the method of making a diamond product in accordance with the present invention, the gas containing the oxygen atom is one of $O_2$, $CO_2$, and a mixed gas composed of $O_2$ and $CO_2$.

The diamond product in accordance with one aspect of the present invention comprises a diamond substrate; a plurality of aligned protrusions made of diamond, formed on the diamond substrate by etching, and arranged according to a predetermined rule; and a plurality of subsidiary protrusions randomly formed between the plurality of aligned protrusions upon etching; wherein the aligned protrusions have a side face with an angle of inclination of at least 78°, whereas the subsidiary protrusions have a top part which is not flat, and the number of the subsidiary protrusions is not greater than 20 per 25 $\mu m^2$.

Among diamond products in which a plurality of protrusions are formed by etching, those having such a small number of subsidiary protrusions with their aligned protrusions having side faces with an angle of inclination of at least 78° have not conventionally existed. For example, the above-mentioned manufacturing method of the present invention can make a diamond product having a flat surface with aligned protrusions having substantially perpendicular side faces as such. The portion of diamond substrate covered with the mask layer can attain a flat top part when the mask layer is removed. However, the subsidiary protrusions are formed in a portion not covered with the mask, whereby their top part is not flat. Here, the condition that the number of the subsidiary protrusions is not greater than 20 per 25 $\mu m^2$ also encompasses the case where there is no subsidiary protrusion.

The diamond product in accordance with another aspect of the present invention comprises a diamond substrate having a recess formed by etching; and a plurality of subsidiary protrusions randomly formed at a bottom part of the recess upon etching; wherein the recess has a side face with an angle of inclination of at least 78°, whereas the subsidiary protrusions have a top part which is not flat, and the number of the subsidiary protrusions is not greater than 20 per 25 $\mu m^2$.

Among diamond products in which a recess is formed by etching, those having such a small number of subsidiary protrusions with their recess having a side face with an angle of inclination of at least 78° have not conventionally existed. The above-mentioned manufacturing method of the present invention can make a diamond product having a flat surface (bottom part of the recess) with the recess having a substantially perpendicular side face as such. Here, the condition that the number of the subsidiary protrusions is not greater than 20 per 25 μm² also encompasses the case where there is no subsidiary protrusion.

The diamond product in accordance with another aspect of the present invention comprises a diamond substrate; one protrusion made of diamond and formed on the diamond substrate by etching; and a plurality of subsidiary protrusions randomly formed about the one protrusion upon etching; wherein the one protrusion has a side face with an angle of inclination of at least 78°, whereas the subsidiary protrusions have a top part which is not flat, and the number of the subsidiary protrusions is not greater than 20 per 25 μm².

Among diamond products in which one protrusion is formed by etching, those having such a small number of subsidiary protrusions with the one protrusion having a side face with an angle of inclination of at least 78° have not conventionally existed. The above-mentioned manufacturing method of the present invention can make a diamond product having a flat surface with the one protrusion having substantially perpendicular side faces as such. The portion of diamond substrate covered with the mask layer can attain a flat top part when the mask layer is removed. However, the subsidiary protrusions are formed in a portion not covered with the mask, whereby their top part is not flat. Here, the condition that the number of the subsidiary protrusions is not greater than 20 per 25 μm² also encompasses the case where there is no subsidiary protrusion.

The method of making a diamond product in accordance with another aspect of the present invention is a method of making a diamond product by etching, the method comprising the steps of forming a diamond substrate with a mask layer; and etching the diamond substrate formed with the mask layer with a plasma of a mixed gas composed of a gas containing an oxygen atom and a gas containing a halogen atom; wherein, in an emission spectrum of the mixed gas, an intensity A of an emission peak caused by the oxygen atom and an intensity B of an emission peak caused by oxygen have an intensity ratio A/B which is greater than the intensity ratio A/B obtained from an emission of a plasma which is 100% oxygen.

The greater the intensity ratio A/B is, the greater becomes the ratio of oxygen atom (O) to oxygen ($O_2$). The oxygen atom is easier to etch diamond than is the oxygen molecule, thus improving the etching speed. Also, the mask layer is formed with a firm oxide film as the oxygen atom concentration increases. Therefore, the mask layer is restrained from being shaved laterally, whereby the etched side faces can be made substantially perpendicular. Further, the halogen atom can remove the unnecessary protrusions formed upon etching.

Preferably, the gas containing the halogen atom in the above-mentioned mixed gas is $CF_4$, and the mixed gas further contains nitrogen gas. The inventors have found that, when the mixed gas is composed as such, the intensity ratio A/B improves, thereby enhancing the diamond etching speed.

Also, the emission peak caused by the oxygen atom may have a half width of 3 nm or less, whereas the emission peak caused by oxygen may have a half width greater than 3 nm.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIG. 10 is a chart showing etching conditions of Examples and Comparative Examples;

FIG. 11 is a chart showing results of experiments of Examples and Comparative Examples;

DESCRIPTION OF THE PREFERRED EMBODIMENTS

In the following, preferred embodiments of the method of making a diamond product and the diamond product in accordance with the present invention will be explained in detail with reference to the accompanying drawings. Here, constituents identical to each other will be referred to with numerals identical to each other without repeating their overlapping explanations.

First Embodiment

Figure 1:
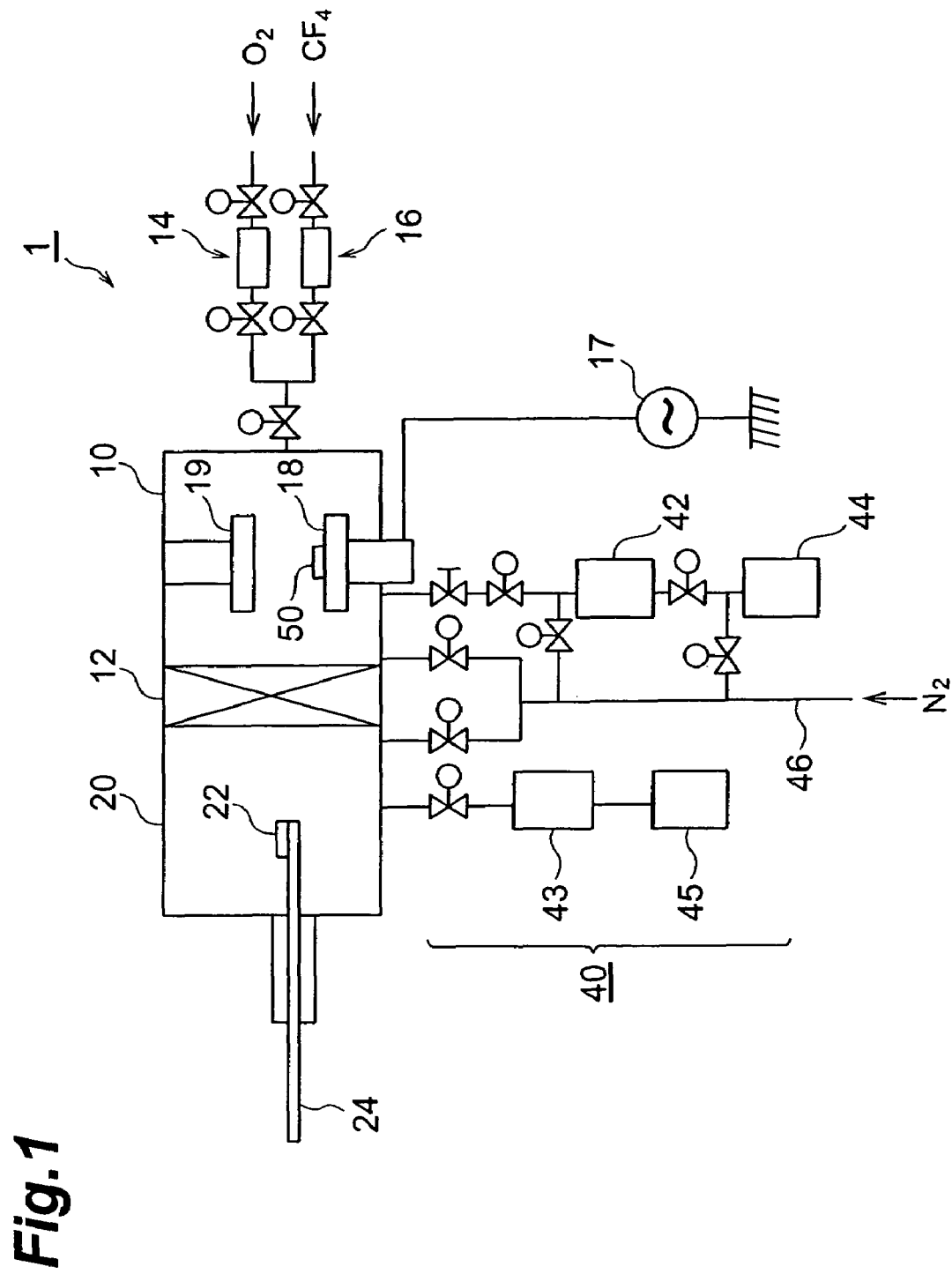
FIG. 1 is a schematic diagram showing an etching apparatus for making a diamond product.

FIG. 1 is a schematic diagram showing the etching apparatus employed in the first embodiment. This etching apparatus 1 comprises an etching chamber 10 for subjecting a diamond substrate 50 to RIE (Reactive Ion Etching), and an introduction chamber 20 communicating therewith by way of a gate valve 14 adapted to open and close. The introduction chamber 20 is a space for introducing the diamond substrate 50 into the etching chamber 10 and is provided in order that the etching chamber 10 can easily attain a vacuum state therein. Also, the etching apparatus 1 is configured such that a substrate carrier member 24 can be introduced therein from the left side in the drawing by opening a lid of the introduction chamber 20, which is not depicted. The front end part of the substrate carrier member 24 is equipped with a substrate holder 22 for holding the diamond substrate 50. By use of the substrate carrier member 24, the diamond substrate 50 set to the substrate holder 22 in the outside of the etching apparatus 1 can be transported into the etching chamber 10.

The etching chamber 10 is provided with two lines of gas introduction units 14, 16 each constituted by valves and a mass flow controller. The gas introduction unit 14 is used for introducing $O_2$ gas into the etching chamber 10, whereas the gas introduction unit 16 is used for introducing $CF_4$ gas (a gas containing fluorine) into the etching chamber 10. Namely, this embodiment utilizes a mixed gas composed Of $O_2$ gas and $CF_4$ gas. Though the gas containing fluorine is not limited to $CF_4$ gas, the etching process for the diamond substrate 50 can be carried out smoothly by using $CF_4$ gas, which is safe and easy to use.

The concentration of $CF_4$ gas with respect to the total number of atoms in the mixed gas is set so as to fall within the range of 0.04% to 6% in the etching chamber 10. Namely, in this embodiment, the concentration of $CF_4$ gas with respect to the total number of atoms in the mixed gas is set so as to fall within the range of 0.02% to 3%. In place of $O_2$ gas, a gas containing an oxygen atom such as $CO_2$ gas or a mixed gas composed of $O_2$ and $CO_2$ may also be used.

Within the etching chamber 10, two plate electrodes 18, 19 are arranged face-to-face in parallel. At the time of etching, the diamond substrate 50 is mounted on the plate electrode 18. The plate electrodes 18, 19 are connected to a high-frequency power source (RF power source) 17. When electric power is supplied between the plate electrodes 18, 19 from the high-frequency power source 17, a discharge occurs between the plate electrodes 18, 19, whereby the mixed gas composed of $O_2$ gas and $CF_4$ gas can attain a plasma state. Also, when a voltage is applied between the plate electrodes 18, 19, a negative bias is imparted to the plate electrode 18 due to the plasma potential.

Connected to the etching chamber 10 and introduction chamber 20 is a conversion mechanism 40 for yielding a vacuum state therein and canceling the vacuum state by introducing $N_2$ gas therein. The conversion mechanism 40 has a turbo pump 42 and a rotary pump 44 on the etching chamber 10 side, and a turbo pump 43 and a rotary pump 45 on the introduction chamber 20 side. When these pumps 42 to 45 are actuated, a vacuum state can be attained within the etching chamber 10 and introduction chamber 20. On the other hand, a gas introduction pipe 46 for introducing $N_2$ gas is connected to the etching chamber 10 and introduction chamber 20. When $N_2$ gas is introduced into the etching chamber 10 and introduction chamber 20 in the vacuum state through the gas introduction pipe 46, lids of the etching chamber 10 and introduction chamber 20 can be opened, so as to let out or let in diamond substrate 50.

The method of making a diamond product in accordance with this embodiment, and the diamond product obtained thereby will now be explained with reference to FIGS. 1 and 2A to 2C.

Figure 2A:
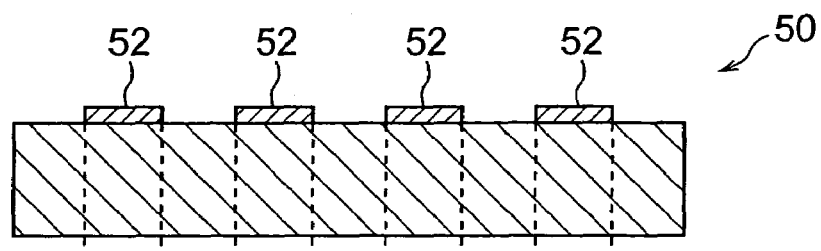
FIGS. 2A to 2C are flowcharts showing a first embodiment of the method of making a diamond product in accordance with the present invention.

First, as shown in FIG. 2A, the diamond substrate 50 is formed with mask layers 52 made of Al by a photolithography technique. The diamond substrate 50 may be any of single-crystal substrates, hetero-epitaxial substrates, and polycrystal substrates. A plurality of mask layers 52, each having a circular form, are formed into a matrix. Namely, the mask layers 52 are arranged according to a matrix rule. Subsequently, the diamond substrate 50 is set to the substrate holder 22 of the substrate carrier member 24, and put into the introduction chamber 20 of the etching chamber 1. Then, the pumps 42 to 45 are actuated so as to yield a vacuum state in the etching chamber 10 and introduction chamber 20. Thereafter, the gate valve 12 is opened, and the diamond substrate 50 is mounted on the plate electrode 18. After the substrate carrier member 24 is drawn out of the etching chamber 10, the gate valve 12 is closed.

After the foregoing preparation, $O_2$ gas and $CF_4$ gas are introduced into the etching chamber 10 from the gas introduction units 14 and 16, respectively. Subsequently, the high-frequency power source 17 is actuated, so as to generate a high-frequency discharge between the plate electrodes 18, 19. Here, it is preferred that the high-frequency power source 17 supply an electric power of at least 0.45 W/cm$^2$ between the two plate electrodes 18, 19. When a discharge occurs between the plate electrodes 18, 19, the mixed gas composed of $O_2$ gas and $CF_4$ gas is excited, so as to attain a plasma state.

Figure 2B:
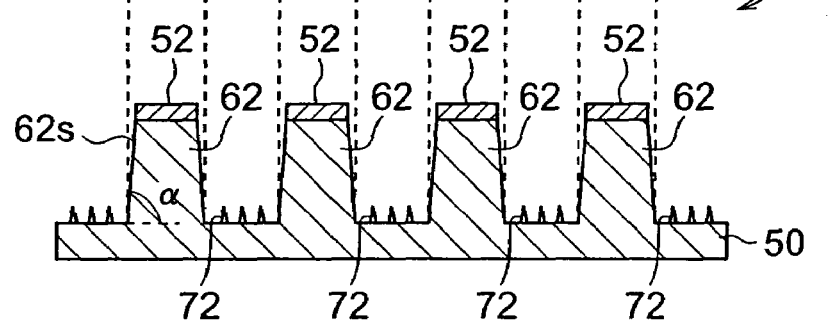
Figure 2C:
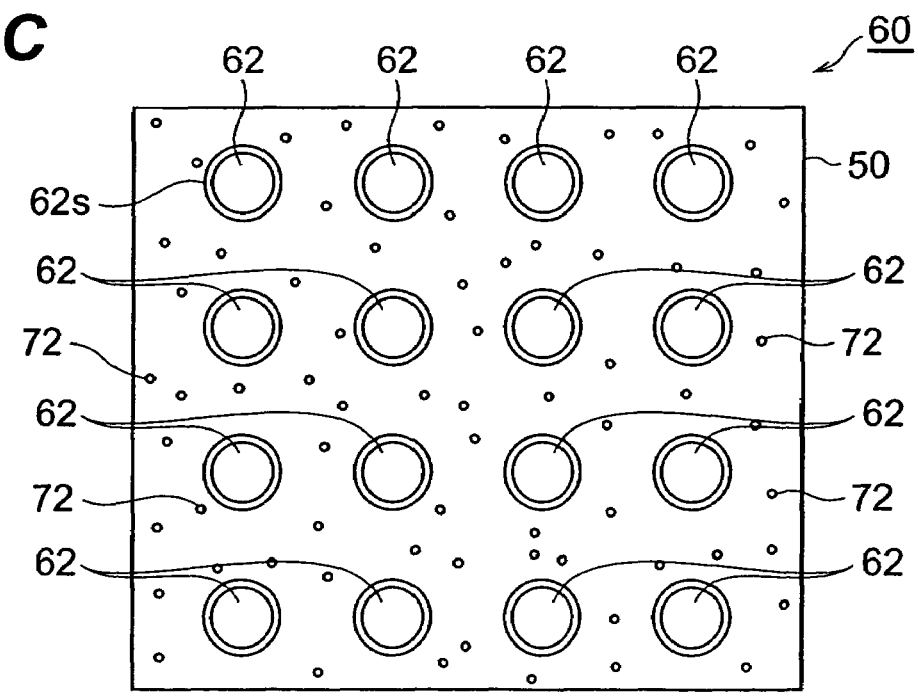

The $O_2$ gas and $CF_4$ gas in the plasma state are attracted toward the plate electrode 18, whereby the diamond substrate 50 is etched. FIG. 2B is a sectional view showing a diamond product 60 formed by etching the diamond substrate 50. FIG. 2C is a plan view showing the diamond product 60 in a state where the mask layers 52 are removed.

As can be seen from FIGS. 2B and 2C, the diamond product 60 in accordance with this embodiment formed by etching has a structure in which a plurality of aligned protrusions 62 formed in conformity to the positions and forms of the respective mask layers 52 are integrated on the diamond substrate 50, whereas a plurality of subsidiary protrusions 72 which are inherently unnecessary are formed among the aligned protrusions 62.

Since a plurality of aligned protrusions 62 are formed in conformity to the respective mask layers 52, they are arranged according to a matrix rule as shown in FIG. 2C. Also, each of the aligned protrusions 62 is utilizable as an emitter for an electron emission device, a rotary shaft or gear for a micro machine, an optical component such as a diffraction grating, diffraction lens, prism, or photonic crystal, a proberon anatomic level (AFM/STM, optical prober, or the like), a mold for a resin or other materials, a marker for inscribing letters or symbols, and the like. Its side face 62S has an angle of inclination α of at least 78°. The angle of inclination of the aligned protrusions 62 thus becomes large and substantially perpendicular due to the following reason. Namely, the mask layers 52 can be restrained from being shaved laterally at the time of etching when the fluorine concentration with respect to the total number of atoms of the mixed gas in the etching chamber 10 is lowered so as to fall within the range of 0.04% to 6%, i.e., the $CF_4$ gas concentration with respect to the total number of molecules is lowered so as to fall within the range of 0.02% to 3%.

A plurality of subsidiary protrusions 72 are randomly formed upon etching at positions not intended by the manufacturer of the diamond product 60, and are unnecessary since they do not function at all when the diamond product 60 is used for electron emission devices and the like. A greater number of such subsidiary protrusions 72 can be removed as the amount of fluorine content in the etching gas is larger. In this embodiment, the number of such subsidiary protrusions 72 is small, i.e., 20 or less per 25 μm$^2$. Such a small number of subsidiary protrusions 72 hardly affect the quality of the electron emission device or the like when the diamond product 60 is used therefor. Namely, even when the fluorine concentration in the mixed gas is lowered to the above-mentioned range, the number of subsidiary protrusions 72 can be reduced to a permissible density. The condition that the number of the subsidiary protrusions 72 is 20 or less encompasses the case where there is no subsidiary protrusion 72.

The top part of such a subsidiary protrusion 72 is often formed a cicular without being flattened. This is because of the fact that, though the aligned protrusions 62 have a flat top part since they are formed in the portion of diamond substrate 50 covered with the mask layers 52, the subsidiary protrusions 72 are formed in the portion of diamond substrate 50 not covered with the mask layers 52.

In this embodiment, the high-frequency power source 17 supplies a high electric power of at least 0.45 W/cm$^2$ between the plate electrodes 18, 19, so that the fluorine atom is likely to attain a plasma state, whereby the number of subsidiary protrusions 72 can be made sufficiently small even if the amount of fluorine is small.

Also, since the fluorine concentration is lowered as mentioned above while the concentration of oxygen contributing to etching diamond is enhanced, the etching speed can be increased in this embodiment. Therefore, the method of making a diamond product in accordance with this embodiment is not only utilizable as a process for making an electronic device, but also usable in place of the machining or laser processing for grinding or cutting diamond.

When the method of this embodiment is used in place of machining, the process can be done in a shorter period of time as compared with machining, and there is no fear of the diamond substrate breaking due to the pressure occurring at the time of machining. While the machining cannot partly remove the diamond substrate by using a mask, it can be achieved in this embodiment.

While the laser processing requires a cutting margin of about 20 μm to about 40 μm when cutting a diamond substrate having a thickness of 100 μm, for example, the cutting margin can be reduced to about 5 μm or less by the method of this embodiment in which etched side faces become substantially perpendicular. Therefore, a greater number of protrusions and depressions can be formed in the same substrate. In the laser processing, on the other hand, a graphite layer, which is an electrically conductive layer, is formed on side faces, whereby the side faces have to be processed in diamond substrates which require electric insulation. Such a process is not necessary in this embodiment. Further, the diamond substrate can be prevented from being damaged by the heat of laser in this embodiment.

The method of this embodiment capable of perpendicular etching can increase the height of aligned protrusions 62 or depth of depressions 76 in the diamond product. Also, a large number of protrusions 62 or depressions 76 can be formed with very small intervals. Therefore, the surface area of diamond product drastically increases as compared with that conventionally available. When the diamond product having this effect is utilized, chemical electrodes for detecting chemical substances, sensor electrodes for detecting acids and alkalis, secondary electrodes, and the like can be manufactured with a small size, a high sensitivity, and a high performance.

Though the diamond substrate 50 is formed with a plurality of aligned protrusions 62 in this embodiment, the diamond substrate may be formed with only one diamond protrusion whose side face has an angle of inclination of at least 78° by etching, whereas the number of subsidiary protrusions randomly formed about this protrusion is set to 20 or less per 25 μm$^2$.

Second Embodiment

Figure 3A:
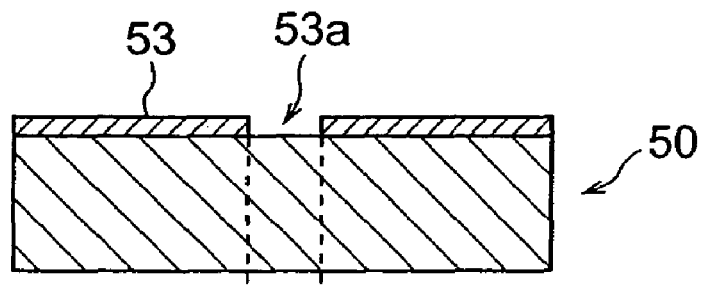
FIGS. 3A to 3C are flowcharts showing a second embodiment of the method of making a diamond product in accordance with the present invention.

The second embodiment of the present invention will now be explained with reference to FIGS. 3A to 3C. First, as shown in FIG. 3A, a mask layer 53 made of Al is formed on a diamond substrate 50. A circular window 53a is formed at the center part of the mask layer 53. When the diamond substrate 50 is etched in the same manner as in the first embodiment, a diamond product 70 shown in FIG. 3B can be obtained. FIG. 3C is a plan view of the diamond product 70 in the state where the mask layer 53 is removed.

Figure 3B:
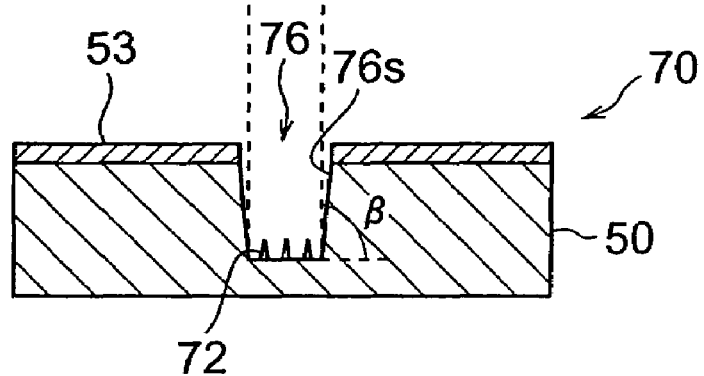
Figure 3C:
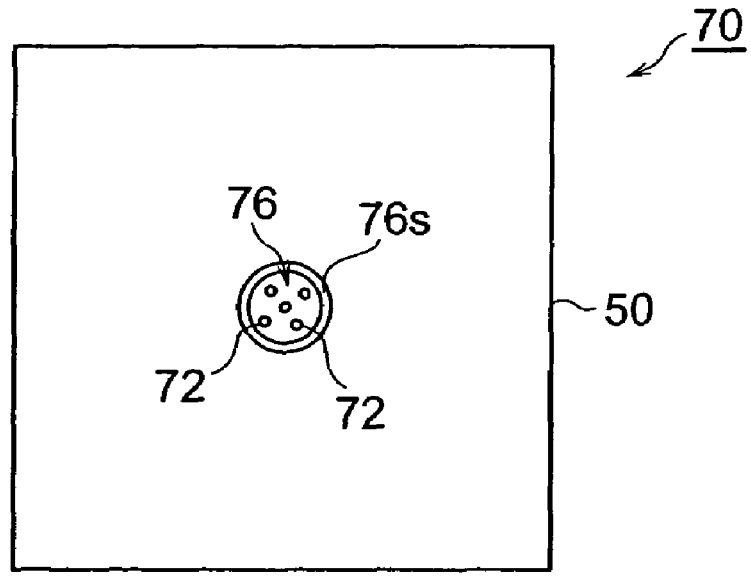

As can be seen from FIGS. 3B and 3C, the diamond product 70 of this embodiment formed by etching has a structure in which the diamond substrate 50 is formed with a depression (recess) 76. The depression 76 is formed in conformity to the position and form of the window 53a of the mask layer 53, and has a bottom face formed with a plurality of subsidiary protrusions 72 which are inherently unnecessary.

The depression 76 has a side face 76S whose angle of inclination β is at least 78°. The angle of inclination β of the side face 76S becomes greater as such due to the following reason. Namely, as in the first embodiment, the mask layer 53 can be restrained from being shaved laterally at the time of etching when the fluorine concentration with respect to the total number of atoms of the mixed gas in the etching chamber 10 is lowered so as to fall within the range of 0.04% to 6%, i.e., the CF$_4$ gas concentration with respect to the total number of molecules is lowered so as to fall within the range of 0.02% to 3%.

A plurality of subsidiary protrusions 72 are randomly formed upon etching at positions not intended by the manufacturer of the diamond product 70. A greater number of such subsidiary protrusions 72 can be removed as the amount of fluorine content in the etching gas is larger. In this embodiment, the number of such subsidiary protrusions 72 is small, i.e., 20 or less per 25 μm$^2$. Such a small number of subsidiary protrusions 72 hardly affect the quality of the diamond product 70 when in use. Namely, even when the fluorine concentration in the mixed gas is lowered to the above-mentioned range, the number of subsidiary protrusions 72 can be reduced to a permissible density.

The top part of such a subsidiary protrusion 72 is often formed a cicular without being flattened. This is because of the fact that, though the portion covered with the mask layer 53 attains a flat top part, the subsidiary protrusions 72 are formed in the portion of diamond substrate 50 not covered with the mask layer 53. The depression (recess) may have a multistage structure instead of the single-stage structure.

Third Embodiment

The third embodiment of the present invention will now be explained. In this embodiment, the gas employed for etching is a mixed gas composed of a gas containing an oxygen atom and a gas containing a halogen atom, while the mixed gas attains a predetermined emission spectrum. Specifically, the mixed gas is subjected to spectrometry, so as to obtain an emission peak X caused by the oxygen atom (O) and an emission peak Y caused by oxygen (O$_2$). Employed for etching in this embodiment is a mixed gas in which the intensity A of emission peak X and the intensity of emission peak Y yield an intensity ratio A/B which is greater than the intensity ratio A/B obtained from the emission of a plasma which is 100% oxygen.

For measuring the spectrum, known light sources, spectrometers, detectors, signal processors, and the like can be utilized. For example, an etching apparatus (RIE) formed with a window through which a plasma can be observed from the outside is employed, and the emission generated by the plasma is made incident on an external spectrometer by use of an optical fiber or the like. Subsequently, its spectrum is acquired, and the spectrum within the wavelength range of 400 nm to 900 nm is observed. Here, it is preferred that not the sheath portion formed in the plasma and substrate but the light-emitting portion be subjected to spectrometry.

Figure 4:
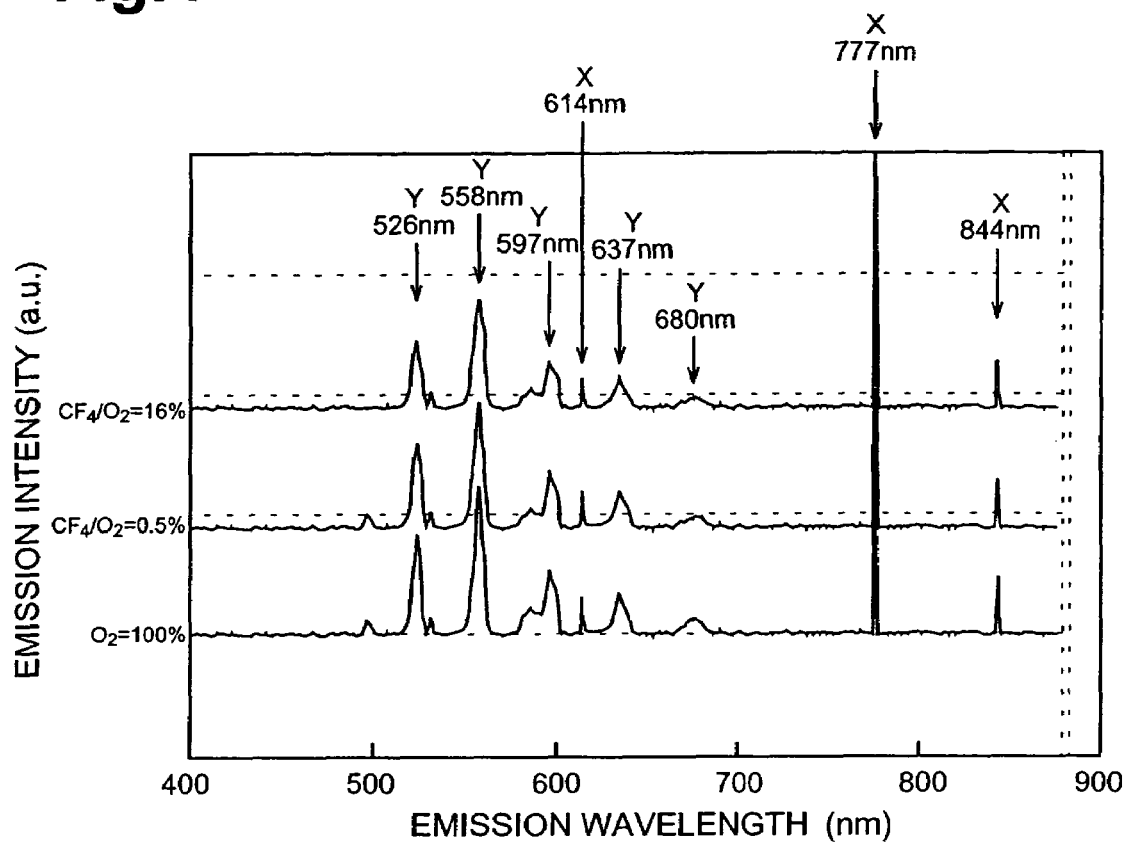
FIG. 4 is a graph showing emission peaks utilized in a third embodiment of the method of making a diamond product in accordance with the present invention.

FIG. 4 is a graph showing relationships between the emission wavelength (nm) of mixed gases and the emission intensity of the spectrum of mixed gases. Each mixed gas contained $CF_4$ as a gas containing a halogen atom, and $O_2$ as a gas containing an oxygen atom. The emission spectrum was measured for each of three patterns of mixed gases in which the $CF_4$ gas and $O_2$ gas had different concentration ratios therebetween. For each pattern of mixed gas, acute emission peaks X caused by the oxygen atom were generated in the vicinity of 614 nm, 777 nm, and 844 nm, whereas emission peaks Y caused by oxygen, which were broader than the emission peaks X, were generated in the vicinity of 526 nm, 558 nm, 597 nm, 637 nm, and 680 nm. Among them, the emission peak X in the vicinity of 777 nm and the emission peak Y in the vicinity of 558 nm have such a high emission intensity that they are easily recognizable, whereby they are easily utilized for calculating the intensity ratio A/B.

Here, each of the emission peaks X caused by the oxygen atom has a half width of 3 nm or less, whereas each of the emission peaks Y caused by oxygen tends to become broader so as to have a half width greater than 3 nm, whereby they are easily distinguishable from each other.

When a mixed gas defined as in this embodiment is utilized in the manufacturing method of the first or second embodiment, the following effect is obtained. As the intensity ratio A/B is greater, the ratio of oxygen atom (O) to oxygen ($O_2$) becomes greater. Since the oxygen atom etches diamond more easily than does the oxygen molecule, the etching speed improves. When the oxygen atom concentration is enhanced, the mask layer is formed with a firm oxide film. Therefore, the mask layer is restrained from being shaved laterally, whereby etched side faces can be made substantially perpendicular. Further, the halogen atom can remove unnecessary protrusions formed at the time of etching.

Due to the following reason, the intensity ratio A/B of etching gas is compared with the intensity ratio A/B obtained from the emission of a plasma which is 100% oxygen. Namely, while the state of a plasma is influenced by various factors such as power, pressure, substrate temperature, and apparatus form, the intensity ratio A/B varies in relation to these factors, whereby it can be considered as a reference value for the substantial effect alone. Specifically, for example, when the power is raised, the oxygen decomposing ratio rises, so that the value of intensity ratio A/B increases, thereby accelerating the diamond etching speed. However, it also yields a negative effect of increasing the ion energy, so that the etching speed of the mask is improved as well, whereby the aimed object cannot be achieved. Therefore, it will be appropriate if the intensity ratio A/B obtained from the emission of a plasma which is 100% oxygen is employed as a reference.

When the mixed gas containing $CF_4$ gas and $O_2$ gas further contains nitrogen gas, the intensity ratio A/B is improved, so that the diamond etching speed is enhanced.

Further, the gas containing a halogen atom in the mixed gas is not limited to $CF_4$ and can utilize various substances such as chlorine, bromine, and iodine as long as it yields an intensity ratio A/B greater than the intensity ratio A/B obtained from the emission of a plasma which is 100% oxygen.

Figure 5:
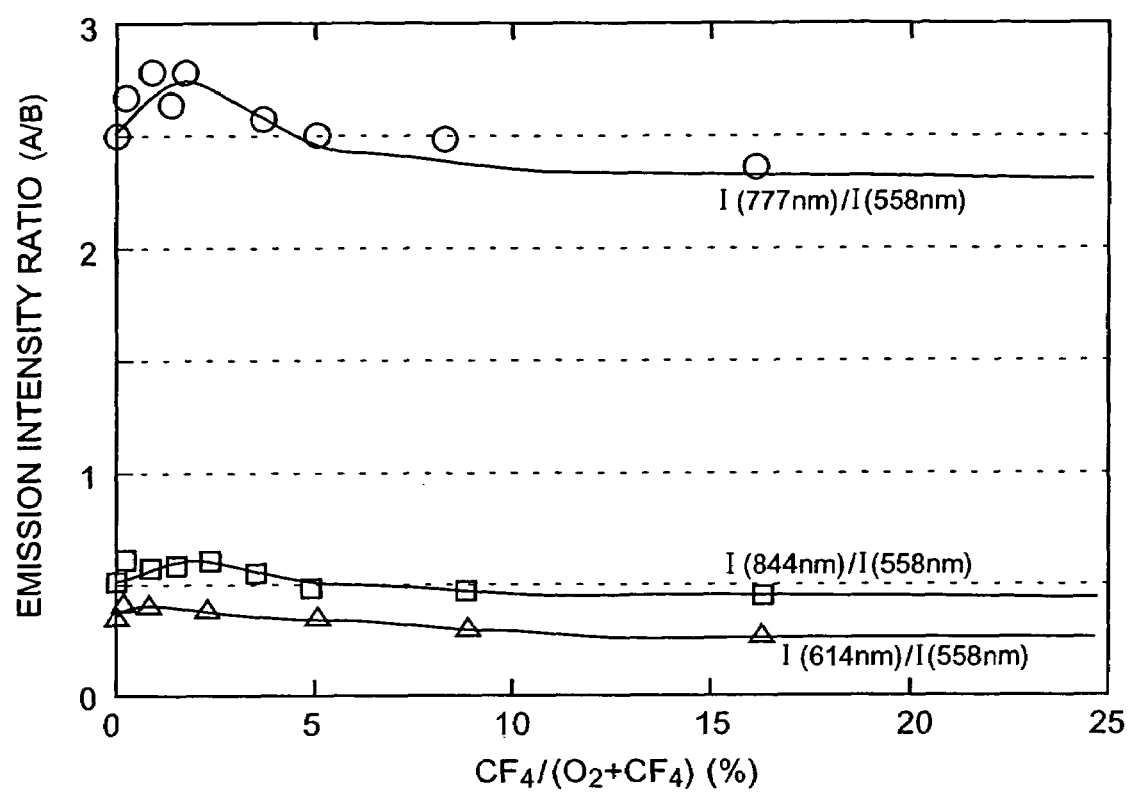
FIG. 5 is a graph showing relationships between the $CF_4$ gas concentration and the emission intensity ratio A/B.

FIG. 5 is a graph showing intensity ratios A/B obtained from a plurality of etching gases among which the concentration ratios of $CF_4$ gas varied while utilizing a mixed gas composed of $CF_4$ gas and $O_2$ gas as each of the etching gases. Each of peaks at wavelengths of 614 nm, 777 nm, and 844 nm was used as the emission peak X, whereas the peak at a wavelength of 558 nm was used as the emission peak Y, whereby the intensity ratio A/B was calculated. Though slight fluctuations were seen in the three measurement results among which the wavelength of emission peak X varied, similar tendencies were obtained.

In FIG. 5, each of the plots where the concentration of $CF_4$ gas is 0% indicates the intensity ratio A/B obtained from the emission of a plasma which is 100% oxygen. These plots are located on the leftmost side in the graph. Mixed gases yielding an intensity ratio greater than the intensity ratio A/B of these plots correspond to the mixed gas in this embodiment. The intensity ratios of individual plots were easily distinguishable from each other in particular when the emission peak X at a wavelength of 777 nm was utilized. Here, the intensity ratio A/B attained its maximum value when the $CF_4$ gas was 1% to 2% of the whole mixed gas, and yielded a value exceeding by about 0.05% to about 3% the intensity ratio A/B obtained from the emission of a plasma which was 100% oxygen.

The effect obtained when the mixed gas further contains nitrogen gas will now be explained with reference to FIG. 6. Here, the emission intensity ratio was calculated for each of two kinds of mixed gases, i.e., a mixed gas composed of $O_2$ gas and $N_2$ gas, and a mixed gas composed of $O_2$ gas, $CF_4$ gas, and $N_2$ gas. The latter mixed gas was doped with 1% of $CF_4$ gas.

Figure 6:
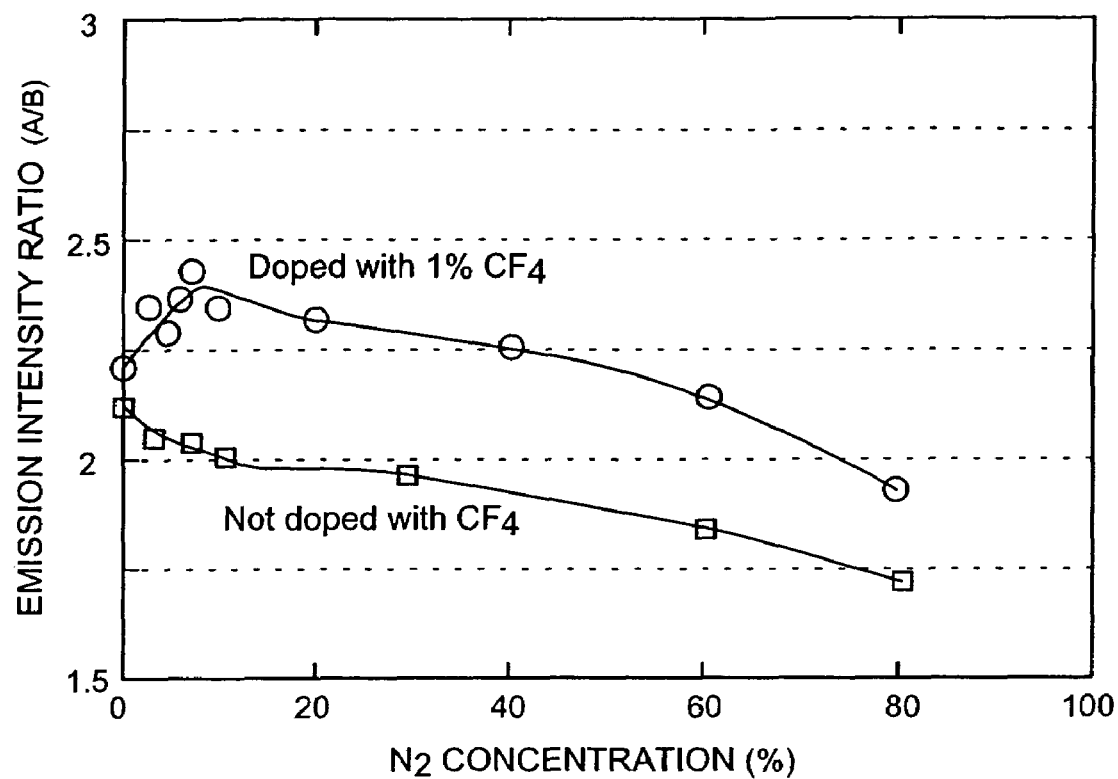
FIG. 6 is a graph showing relationships between the $N_2$ gas concentration and the emission intensity ratio A/B.

When the gas containing no $CF_4$ gas, i.e., the gas containing no halogen atom, was caused to contain $N_2$ gas, the intensity ratio A/B did not attain a maximum value, thereby failing to yield a value exceeding the intensity ratio A/B caused by the emission of a plasma which was 100% oxygen as can be seen from FIG. 6. When the gas containing $CF_4$ gas was caused to contain $N_2$ gas, by contrast, a maximum value was obtained at an appropriate value. These facts have revealed that desirable etching in this embodiment cannot be realized when $N_2$ gas is simply added to $O_2$ gas, but a diamond product having a substantially perpendicular side face and a flat etching face can be obtained when $N_2$ gas is added to a mixed gas containing $O_2$ gas and $CF_4$ gas.

Figure 7:
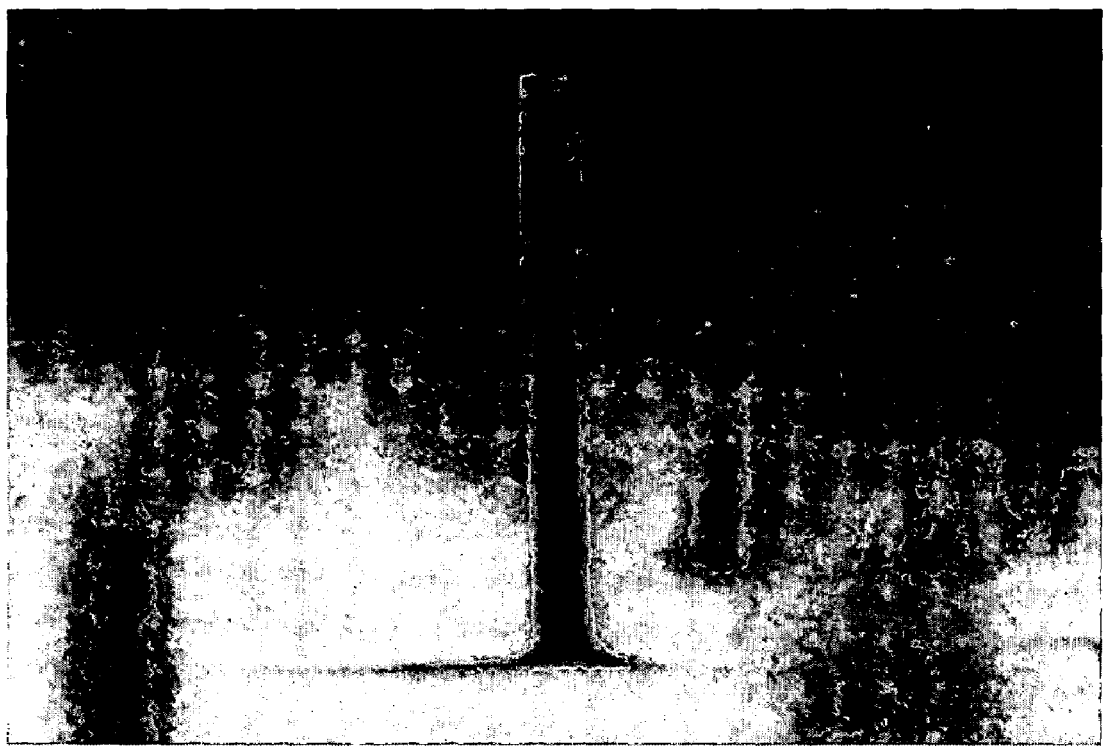
FIG. 7 is an electron micrograph showing a diamond product obtained by the method of the third embodiment.
Figure 8:
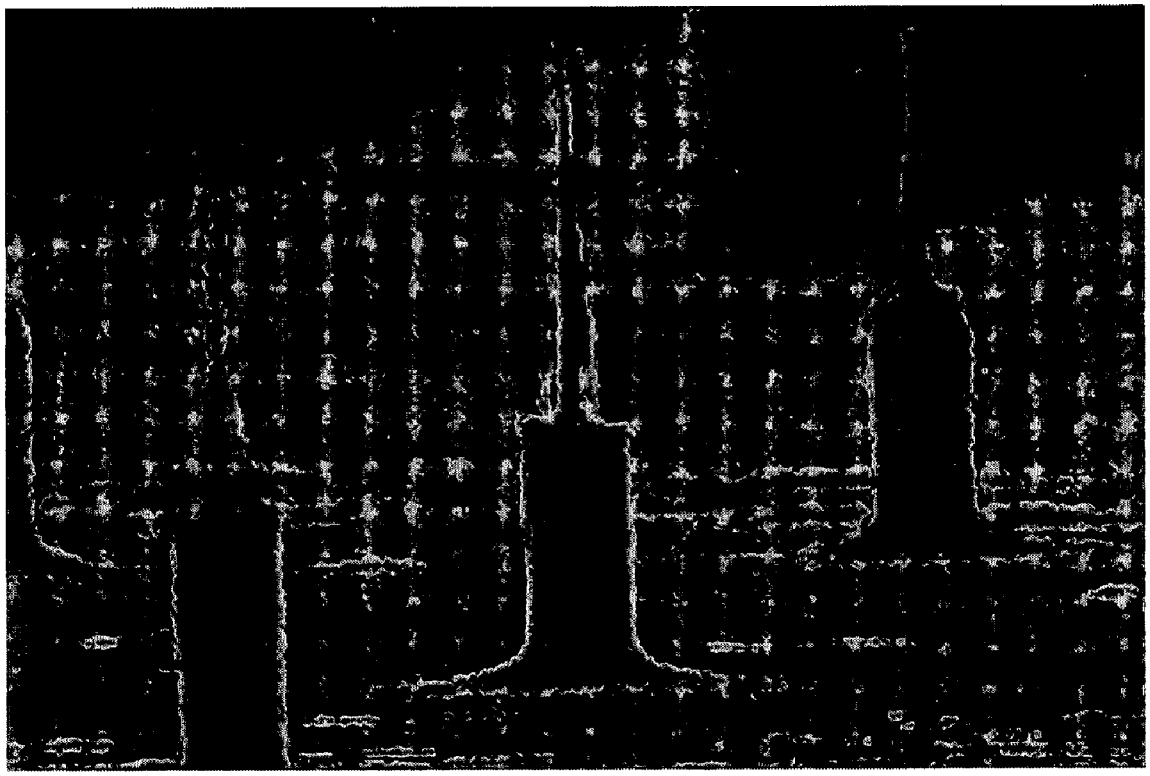
FIG. 8 is an electron micrograph showing a diamond product obtained by the method of the third embodiment.
Figure 9:
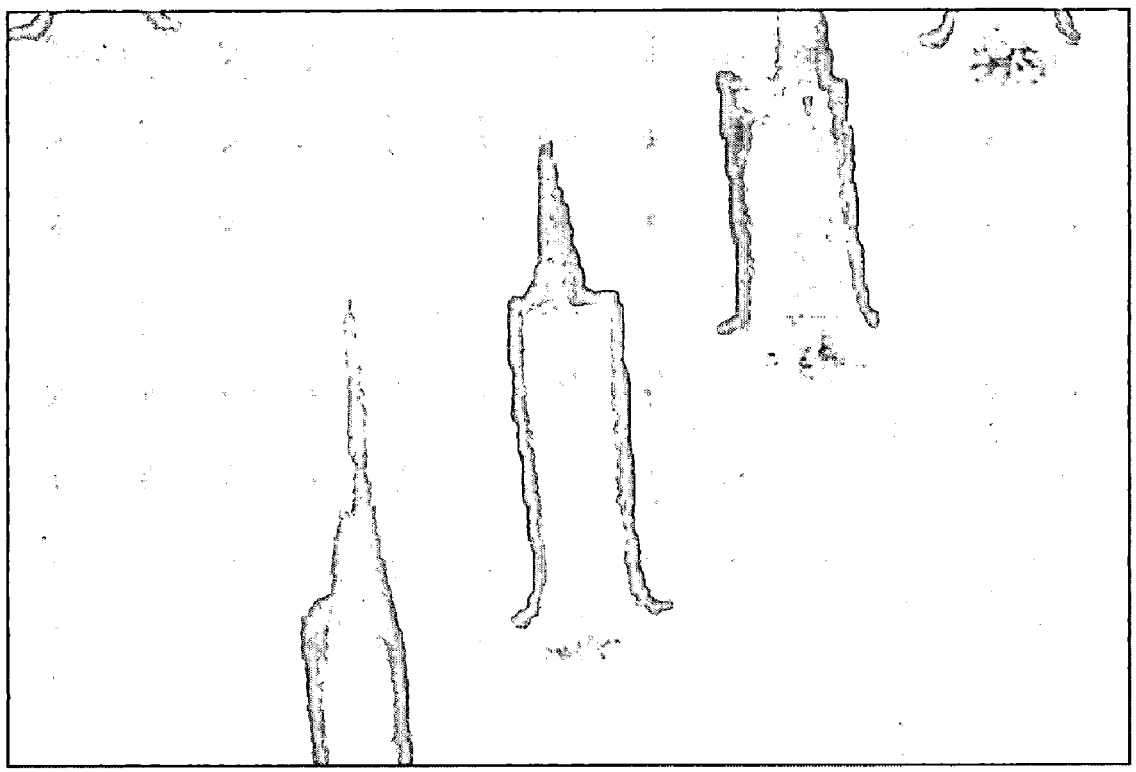
FIG. 9 is an electron micrograph showing a diamond product obtained by the method of the third embodiment.

Also, as can be seen from the electron micrographs of FIGS. 7 to 9, a diamond product having very small protrusions can be formed when a mask layer having a very small area is utilized in the method of this embodiment. These protrusions can be formed directly on the surface of the substrate as shown in FIG. 7, or formed at upper ends of relatively thick protrusions or bulges as shown in FIGS. 8 and 9. The protrusions in FIG. 8 have substantially columnar forms, whereas those in FIG. 9 are formed conical. These protrusions can be utilized as pointed probes or pointed electron emitters.

EXAMPLES

The present invention will now be explained more specifically with reference to Examples.

Using a single-crystal diamond Ib(100) substrate as a diamond substrate, mask layers made of Al were formed into a matrix thereon. As the etching gas, a mixed gas composed of $O_2$ gas and $CF_4$ gas was employed. Then, using the etching apparatus 1 shown in FIG. 1, experiments of Examples 1 to 12 and Comparative Examples 1 to 3 were carried out.

FIG. 10 shows etching conditions of Examples and Comparative Examples, whereas FIG. 11 shows the results of experiments.

As can be seen from FIG. 10, diamond products having aligned protrusions were formed while the $CF_4$ gas concentration (fluorine concentration) with respect to the total number of molecules in the mixed gas was varied among Examples 1 to 6 and Comparative Examples 1 to 3. In Examples 7 to 12, diamond products having aligned protrusions were formed while the output value of high-frequency electric power for generating a plasma was varied under the condition where the $CF_4$ gas concentration was held constant. Each of the flat electrodes in the etching chamber had an area of 177 $cm^2$.

As can be seen from FIG. 11, the surface state of diamond product, the etching speed of diamond substrate in the height direction, the etching depth (height of aligned protrusions), the angle of inclination of side faces of aligned protrusions, the etching speed of the mask layer in the height direction, and the etching selection ratio (the ratio of the etching speed in the height direction of the mask layer to the etching speed in the height direction of the diamond substrate) were measured in these experiments. As for the surface state of diamond product, the case where no subsidiary protrusion exists is indicated by a double circle, the case where the number of subsidiary protrusions is 20 or less per 25 $\mu m^2$ is indicated by a single circle, and the case where the number of subsidiary protrusions exceeds 20 per 25 $\mu m^2$ is indicated by a cross.

When the $CF_4$ gas concentration with respect to the total number of molecules in the mixed gas fell within the range of 0.02% to 3% (the fluorine gas concentration with respect to the total number of atoms in the mixed gas was 0.04% to 6%), as can be seen from Examples 1 to 6, it was possible to form a diamond product having such a favorable surface state that subsidiary protrusions exist by only 20 or less per 25 $\mu m^2$ if any, and aligned protrusions with side faces having an angle of inclination $\alpha$ within the range of 88° to 90°.

Figure 12:
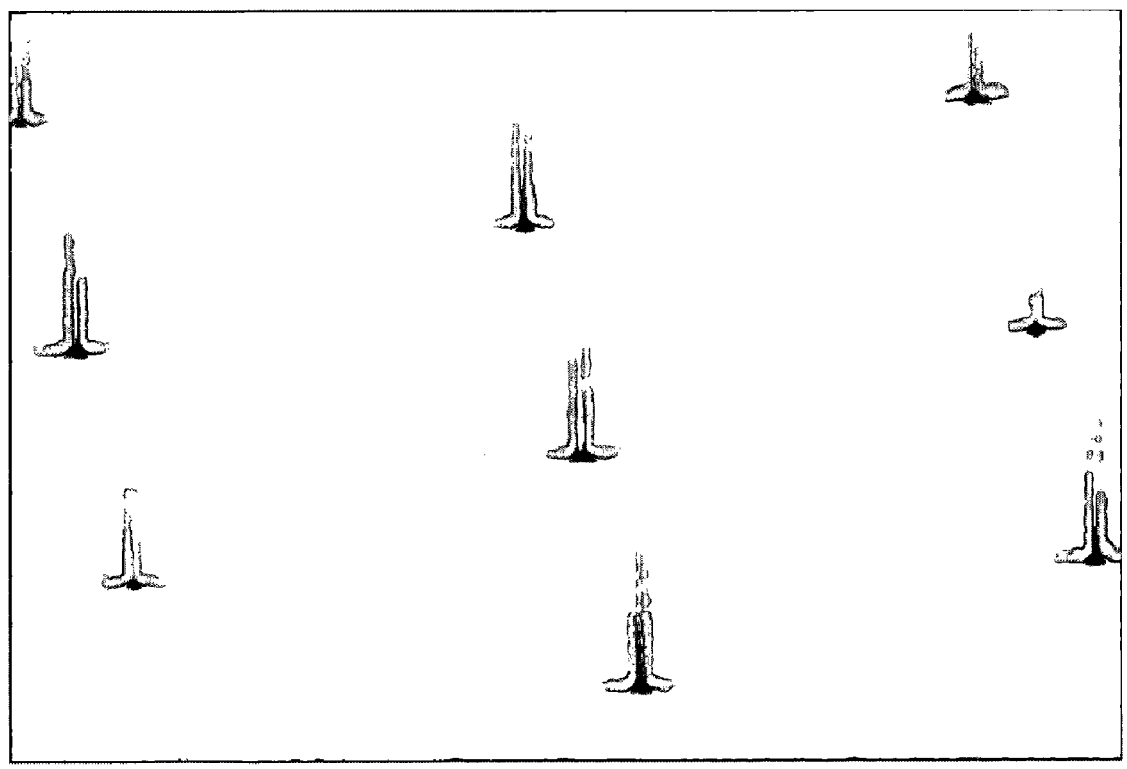
FIG. 12 is a photograph showing the diamond product obtained by Example 3.

FIG. 12 is a photograph showing the diamond product obtained in Example 3 (where the concentration of $CF_4$ gas was 1%). As can be seen from this photograph, the diamond product was formed with a plurality of aligned protrusions arranged in a matrix, whereas no subsidiary protrusions existed. The aligned protrusions exhibited a greater angle of inclination $\alpha$.

Figure 13:
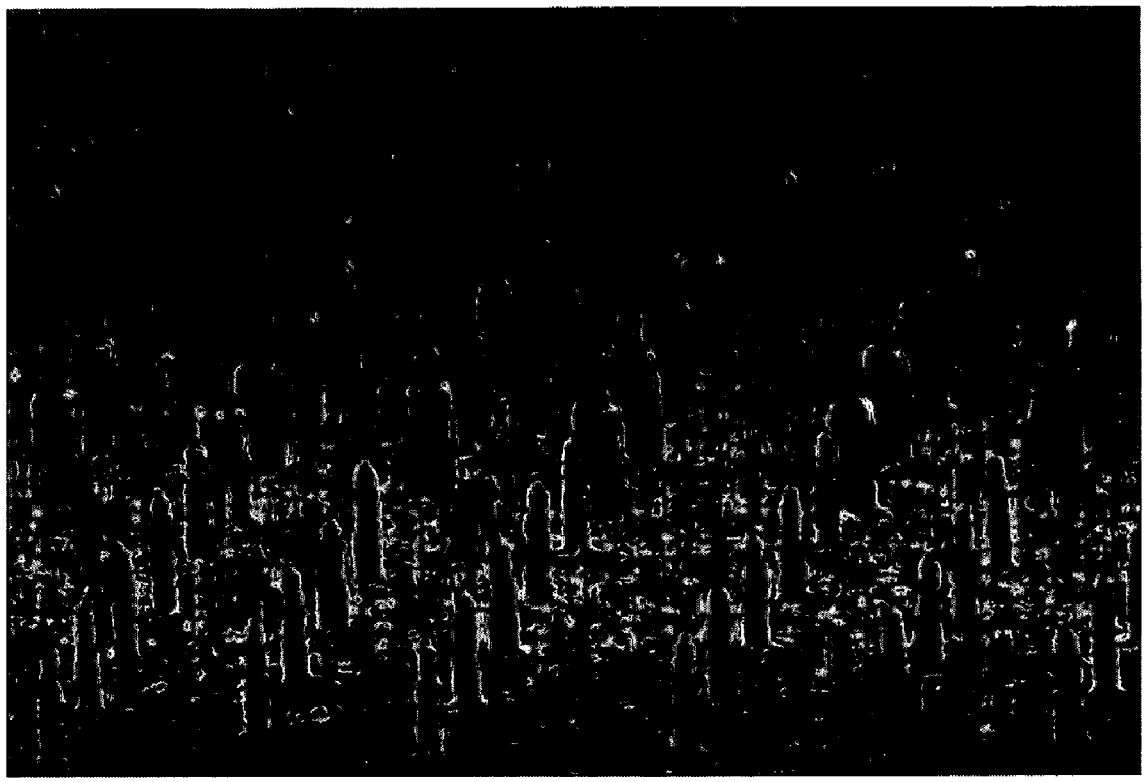
FIG. 13 is a photograph showing the diamond product obtained by Example 4.
Figure 14A:
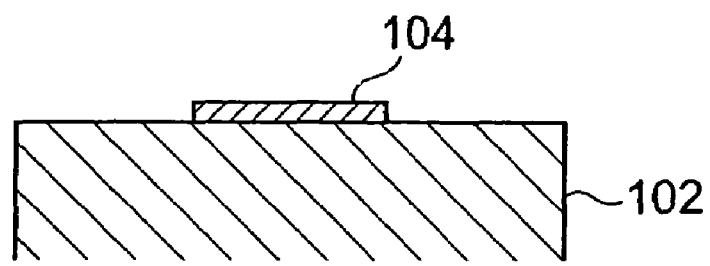
FIGS. 14A and 14B are views employed for explaining a conventional method of making a diamond product.
Figure 14B:
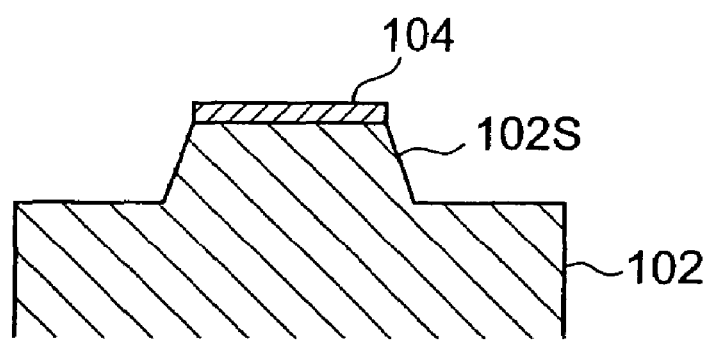

FIG. 13 is a photograph showing the diamond product obtained in Example 4 (where the concentration of $CF_4$ gas was 0.1%). As can be seen from this photograph, the diamond product was formed with a plurality of aligned protrusions arranged in a matrix, whereas subsidiary protrusions were formed among the aligned protrusions. However, the number of subsidiary protrusions was so small that they did not affect the use of the diamond product. The side faces of aligned protrusions were substantially perpendicular.

When the concentration of $CF_4$ gas was increased to 5% as in Comparative Example 1, the mask layers were laterally shaved during etching, so that the angle of inclination $\alpha$ was reduced to 72°. When the concentration of $CF_4$ gas exceeded 5%, substantially all the mask layers were shaved, whereby it was impossible to form aligned protrusions.

When the $CF_4$ gas concentration was reduced to 0.01% or $O_2$ gas was used alone as the etching gas without using $CF_4$ gas as in Comparative Example 2 or 3, the number of subsidiary protrusions exceeded 20 per 25 $\mu m^2$, whereby the surface state of the diamond product was rough.

In Examples 7 to 12, the output of the high-frequency power source was adjusted within the range of 0.28 to 1.1 W/$cm^2$ while the concentration of $CF_4$ gas was fixed at 1%. Each case made it possible to form a diamond product whose Surface state was favorable, whereas its aligned protrusions had a substantially perpendicular side face with an angle of inclination $\alpha$ of at least 78°. In the case where an electric power of at least 0.45 W/$cm^2$ was supplied between the plate electrodes, as can be seen when Examples 7 and 8 are compared with each other, subsidiary protrusions were eliminated, and it was possible to greatly increase the angle of inclination $\alpha$.

While the invention achieved by the inventors is specifically explained with reference to the embodiments and examples in the foregoing, the present invention should not be limited to the above-mentioned embodiments and examples. For example, the aligned protrusions may be formed not only into a matrix, but also into a triangle, a hexagon, and the like as long as they are arranged with a predetermined regularity. The mask layer may be formed not only from Al, but also from materials resistant to oxidization such as $Al_2O_3$, $AlN_x$, $SiO_2$, and Si. Also, the form of aligned protrusions and depressions (recesses) can be changed freely when the form of mask layer is changed. Further, the etching for forming the diamond product may be ECR etching, etching by ICP, or the like without being restricted to the reactive ion etching.

As explained in the foregoing, the present invention can sufficiently flatten the surface of a diamond product, and make etched side faces substantially perpendicular.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method of making a diamond product having a projection or a depression on a surface thereof by etching, said method comprising the steps of:
   forming a diamond substrate with a mask layer including a metal layer in at least one part thereof;
   etching said diamond substrate formed with said mask layer with a plasma of a mixed gas composed of a gas containing an oxygen atom and a gas containing a fluorine atom; and
   monitoring intensity ratio A/B of the mixed gas, where A is an intensity of an emission peak caused by atomic oxygen and B is an intensity of an emission peak caused by molecular oxygen,
   wherein said fluorine atom has a concentration within the range of 0.04% to 6% with respect to the total number of atoms in said mixed gas, said plasma is produced by generating a high-frequency discharge between two plate electrodes, said high-frequency discharge is generated by supplying an electric power of not less than 0.28W/$cm^2$ between said plate electrodes, and said mixed gas further contains nitrogen gas, thereby to form the diamond product having the projection or depression with a side face with an angle of inclination of at least 78 degrees,
   wherein said mixed gas contains nitrogen gas in an amount such that the intensity ratio A/B of said mixture is greater than the intensity ratio A/B of the mixed gas with no nitrogen.

2. A method of making a diamond product according to claim 1, wherein said gas containing said fluorine atom is $CF_4$ gas; and
   wherein said $CF_4$ gas has a concentration within the range of 0.02% to 3% with respect to the total number of molecules in said mixed gas.

3. A method of making a diamond product according to claim 1, wherein said gas containing said oxygen atom is one of $O_2$, $CO_2$, and a mixed gas composed of $O_2$ and $CO_2$.

4. The method of claim 1, wherein the mixed gas contains an $N_2$ concentration that is not less than 2.5% and not more than 40%.

5. The method of making a diamond product according to claim 1, wherein A is the intensity of an emission peak at a wavelength of 777 nm and B is the intensity of an emission peak at a wavelength of 558 nm.

6. The method of making a diamond product according to claim 1, wherein the electric power supplied between said plate electrodes is not more than 0.45 $W/cm^2$.

7. A method of making a diamond product by etching a diamond substrate, said method comprising the steps of:
   etching said diamond substrate using a plasma of a mixed gas, wherein the plasma of the mixed gas comprises oxygen atoms, fluorine atoms, and nitrogen atoms;
   generating a high-frequency discharge between two plate electrodes by supplying an electric power of not less than 0.28 $W/cm^2$ between said plate electrodes;
   monitoring intensity ratio A/B of the mixed gas, where A is an intensity of an emission peak caused by atomic oxygen and B is an intensity of an emission peak caused by molecular oxygen, and
   wherein the mixed gas has a fluorine atom concentration within the range of 0.04% to 6% with respect to the total number of atoms in said mixed gas, and wherein said mixed gas contains nitrogen gas in an amount such that the intensity ratio A/B of said mixture is greater than the intensity ratio A/B of the mixed gas with no nitrogen.

8. The method of claim 7, wherein the diamond substrate has a mask, and wherein the diamond product has an angle of inclination of at least 78 degrees.

9. The method of claim 7, wherein the mixed gas contains an $N_2$ concentration that is not less than 2.5% and not more than 40%.

10. The method of making a diamond product according to claim 7, wherein A is the intensity of an emission peak at a wavelength of 777 nm and B is the intensity of an emission peak at a wavelength of 558 nm.

11. The method of making a diamond product according to claim 7, wherein the electric power supplied between said plate electrodes is not more than 0.45 $W/cm^2$.

\* \* \* \* \*